(12) United States Patent
Steck et al.

(10) Patent No.: US 6,750,096 B2
(45) Date of Patent: Jun. 15, 2004

(54) TRENCH CAPACITOR WITH BURIED PLATE AND METHOD FOR ITS PRODUCTION

(75) Inventors: Sabine Steck, Bad Säckingen (DE); Martin Schrems, Eggersdorf (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/078,997

(22) Filed: Feb. 20, 2002

(65) Prior Publication Data

US 2002/0137308 A1 Sep. 26, 2002

Related U.S. Application Data

(63) Continuation of application No. PCT/DE00/02650, filed on Aug. 3, 2000.

(30) Foreign Application Priority Data

Aug. 20, 1999 (DE) .......................................... 199 39 589

(51) Int. Cl.[7] .......................................... H01L 21/8242
(52) U.S. Cl. ...................... 438/243; 438/244; 438/249; 438/386; 438/389; 438/392
(58) Field of Search ................................. 438/243, 244, 438/246, 247, 249, 386, 387, 389, 390, 392; 257/301

(56) References Cited

U.S. PATENT DOCUMENTS

| 4,604,150 | A | * | 8/1986 | Lin ............................. 148/188 |
|---|---|---|---|---|
| 4,649,625 | A | | 3/1987 | Lu |
| 5,065,273 | A | | 11/1991 | Rajeevakumar |
| 5,310,698 | A | | 5/1994 | Wild |
| 5,512,767 | A | | 4/1996 | Noble, Jr. |
| 5,618,751 | A | * | 4/1997 | Golden et al. .............. 438/392 |
| 5,641,694 | A | | 6/1997 | Kenney |
| 5,658,816 | A | | 8/1997 | Rajeevakumar |
| 5,691,549 | A | | 11/1997 | Lam et al. |
| 5,736,760 | A | | 4/1998 | Hieda et al. |
| 5,744,386 | A | | 4/1998 | Kenney |
| 5,831,301 | A | | 11/1998 | Horak et al. |
| 5,867,420 | A | | 2/1999 | Alsmeier |
| 5,869,868 | A | | 2/1999 | Rajeevakumar |
| 5,913,132 | A | * | 6/1999 | Tsai ........................... 438/434 |

FOREIGN PATENT DOCUMENTS

| EP | 0 271 072 A1 | 6/1988 |
|---|---|---|
| EP | 0 949 680 A2 | 10/1999 |
| JP | 62 092 460 | 4/1987 |
| JP | 02 203 305 A | 8/1990 |
| WO | WO 98/52211 | 11/1998 |

* cited by examiner

*Primary Examiner*—Jack Chen
(74) *Attorney, Agent, or Firm*—Laurence A. Greenberg; Werner H. Stemer; Ralph E. Locher

(57) ABSTRACT

A method for forming a trench with a buried plate includes the steps of forming a trench in a substrate, depositing a non-doped silicate oxide in the trench and placing a doped silicate glass filling thereon. A buried trench plate is formed around the lower region of the trench in the substrate.

10 Claims, 5 Drawing Sheets

FIG 5
FIG 6
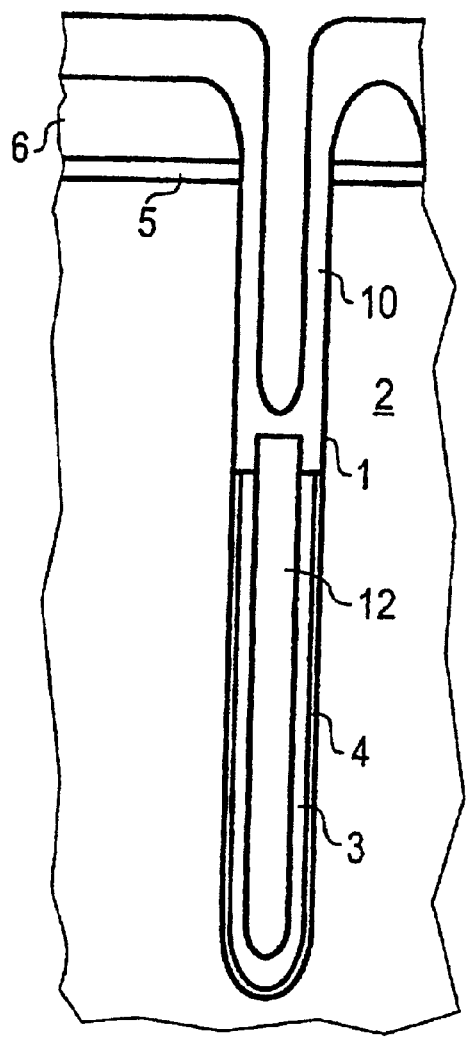
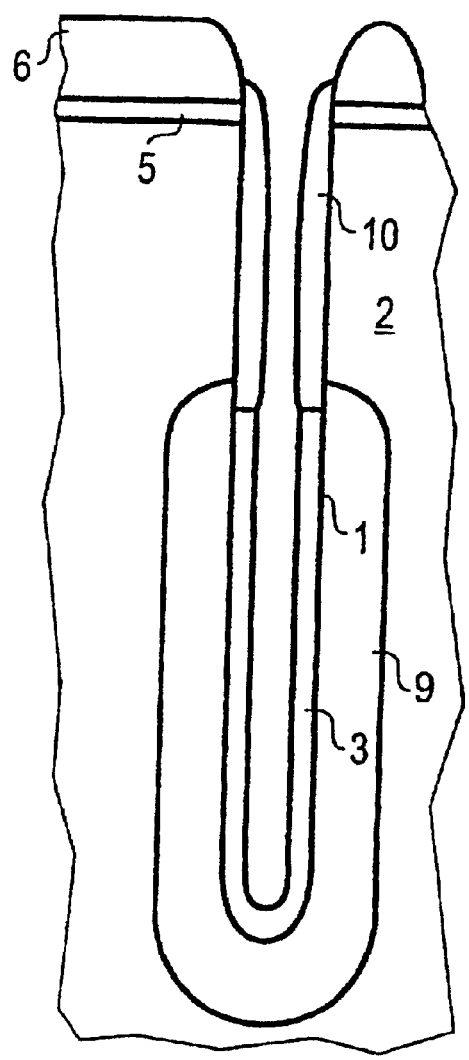

TRENCH CAPACITOR WITH BURIED PLATE AND METHOD FOR ITS PRODUCTION

CROSS-REFERENCE TO RELATED APPLICATION

This application is a continuation of copending International Application No. PCT/DE00/02650, filed Aug. 3, 2000, which designated the United States.

BACKGROUND OF THE INVENTION

Field of the Invention

The invention lies in the field of integrated circuits. The invention relates to a trench capacitor and a corresponding production method.

For discussion purposes, the invention will be described with reference to the formation of a single trench capacitor.

Integrated circuits (ICs) or chips contain capacitors for purposes of the charge storage element, for instance, a dynamic random access memory (DRAM). The charge status in the capacitor represents a data bit.

A DRAM chip contains a matrix of memory cells configured in rows and columns, which are controlled by word lines and bit lines. The reading of data from the memory cells or the writing of data therein is accomplished by activating appropriate word lines and bit lines. A DRAM memory cell typically contains a transistor that is connected to a capacitor.

The charge stored in the capacitor dissipates over time due to leakage currents. Before the charge dissipates to an indeterminate level below a threshold value, the storage capacitor must be refreshed. For this reason, such memory cells are referred to as dynamic RAM (DRAM). Methods for producing memory capacitors are taught in the following documents: U.S. Pat. No. 5,867,420 to Alsmeier, U.S. Pat. No. 5,065,273 to Rajeevakumar, U.S. Pat. No. 4,649,625 to Nicky C. Lu, U.S. Pat. No. 5,658,816 to Rajeevakumar, U.S. Pat. No. 5,512,767 to Noble, Jr., U.S. Pat. No. 5,869,868 to Rajeevakumar, U.S. Pat. No. 5,691,549 to Lam, et al., U.S. Pat. No. 5,641,694 to Kenney, U.S. Pat. No. 5,744,386 to Kenney, U.S. Pat. No. 5,310,698 to Wild, U.S. Pat. No. 5,831,301 to Horak et al., and Europe Patent No. 0 949 680 A2, corresponding to U.S. Pat. No. 6,008,104 to Schrems. A substep in the forming of a trench capacitor is the forming of a buried plate that forms the outer capacitor electrode.

The closest prior art with respect to the forming of the buried plate is European Patent Application 0 271 072, corresponding to U.S. Pat. No. 4,755,486 to Treichel et al. Typically, the buried plate is disposed in the lower region of the trench capacitor, and an insulating collar isolates the upper region of the trench. The object of the insulating collar is, among other things, to prevent leakage currents between the two capacitor electrodes of the trench capacitor. It is, therefore, necessary that leakage currents occurring as a consequence of dopant residues be avoided in the region of the insulating collar. The dopant residues emerge in the forming of the buried plate. The forming of a buried plate for the purpose of producing a trench capacitor is described in U.S. Pat. No. 5,618,751 to Golden et al., which first describes that an arsenic-doped glass layer being deposited in the trench directly on the exposed silicon substrate. An undoped glass or ozonic TEOS is deposited on the arsenic-doped glass layer. Next, the trench is filled with varnish. In the top region of the trench, the layers are removed again. Lastly, in a drive-in step at elevated temperature, the buried plate is formed by diffusion of the dopant out of the arsenic-doped glass.

SUMMARY OF THE INVENTION

It is accordingly an object of the invention to provide a trench with buried plate and method for its production that overcomes the hereinafore-mentioned disadvantages of the heretofore-known devices and methods of this general type and that forms the buried plate such that dopant residues do not remain in the top region of the trench where the insulating collar is formed, and, thus, leakage currents that can discharge the trench capacitor are avoided.

With the foregoing and other objects in view, there is provided, in accordance with the invention, a method for forming a trench with a buried plate, including the steps of forming a trench in a substrate, the trench having a sidewall, an upper region, and a lower region, forming an undoped silicon oxide layer on the trench sidewall in the upper and lower regions of the trench, forming a doped silicate glass fill in the upper and lower regions of the trench, removing the doped silicate glass fill and the undoped silicon oxide layer from the upper region of the trench, and increasing temperature to diffuse dopant from the doped silicate glass fill into the substrate through the undoped silicon oxide layer and to form a buried plate in the substrate in the lower region of the trench.

In the method according to the invention, a trench is etched in a substrate, and an undoped silicon oxide layer is formed, on which a doped silicate glass fill is applied. In another advantageous step of the method according to the invention, the dopant diffuses from the doped silicate glass fill through the undoped silicon oxide layer during a temperature step and forms a buried plate.

The underlying idea of the invention is to form an undoped silicon oxide layer below the silicate glass fill that delivers the dopant for the buried plate. As such, with the aid of oxide etching the doped silicate glass can be removed from the region of the upper trench in which the insulating collar is formed without leaving any residues. This result occurs because of the protective undoped silicon oxide layer, which keeps the dopant from the silicate glass fill away from the sidewall of the trench. With the etching process that removes the silicate glass fill and the undoped silicon oxide layer, the silicate glass fill is completely removed through the underlying undoped silicon oxide.

In accordance with another mode of the invention, the doping of the undoped silicon oxide layer is less than $10^{18}$ cm$^{-3}$, and the doping of the doped silicate glass fill is greater than $10^{18}$ cm$^{-3}$.

In accordance with a further mode of the invention, at least one of the group consisting of boron, phosphorous, and arsenic is used for the doping of the doped silicate glass fill.

In accordance with an added mode of the invention, the undoped silicon layer is formed by thermal oxidation.

In accordance with an additional mode of the invention, the undoped silicon oxide layer is formed in an integrated processing step immediately prior to the deposition of the doped silicate glass fill.

In accordance with yet another mode of the invention, the undoped silicon oxide layer is deposited in an integrated processing step immediately prior to the doped silicate glass fill.

In accordance with yet a further mode of the invention, the undoped silicon oxide layer is formed to a thickness between 0.1 and 25 nm.

In accordance with yet an added mode of the invention, the trench having the doped silicate glass fill is filled with varnish, the varnish in the upper region of the trench is removed, the doped silicate glass fill and the undoped silicon oxide layer are removed in the upper region of the trench, the remaining varnish is removed from the trench, an oxide cover layer is deposited and then temperature is increased to diffuse dopant into the substrate, and the oxide cover layer, the doped silicate glass fill, and the undoped silicon oxide layer are removed.

In accordance with yet an additional mode of the invention, the oxide cover layer is removed and the doped silicate glass fill and the undoped silicon oxide layer are removed from the lower region of the trench.

In accordance with again another mode of the invention, the trench having the doped silicate glass fill is filled with a sacrificial silicon material, the sacrificial silicon material, the doped silicate glass fill, and the undoped silicon oxide layer are removed in the upper region of the trench, temperature is subsequently increased to diffuse dopant into the substrate, an insulation trench layer is deposited in the upper region of the trench, and the sacrificial silicon material, the doped silicate glass fill, and the undoped silicon oxide layer are removed from the lower region of the trench.

In accordance with a concomitant mode of the invention, a second undoped silicon oxide layer is deposited in the trench having the doped silicate glass fill, the trench is filled with varnish, the varnish, the second undoped silicon oxide layer, the doped silicate glass fill, and the undoped silicon oxide layer are removed in the upper region of the trench, the varnish is removed in the lower region of the trench, and temperature is subsequently increased to diffuse dopant into the substrate.

Other features that are considered as characteristic for the invention are set forth in the appended claims.

Although the invention is illustrated and described herein as embodied in a trench with buried plate and method for its production, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 5 is a fragmentary, cross-sectional view of the trench FIG. 1 at a later time in a second embodiment of the production method;

FIG. 6 is a fragmentary, cross-sectional view of the trench of FIG. 5 at a later time in the second production method;

DESCRIPTION OF THE PREFERRED EMBODIMENTS

In the figures of the drawings, unless stated otherwise, identical reference symbols denote identical parts.

Figure 1:
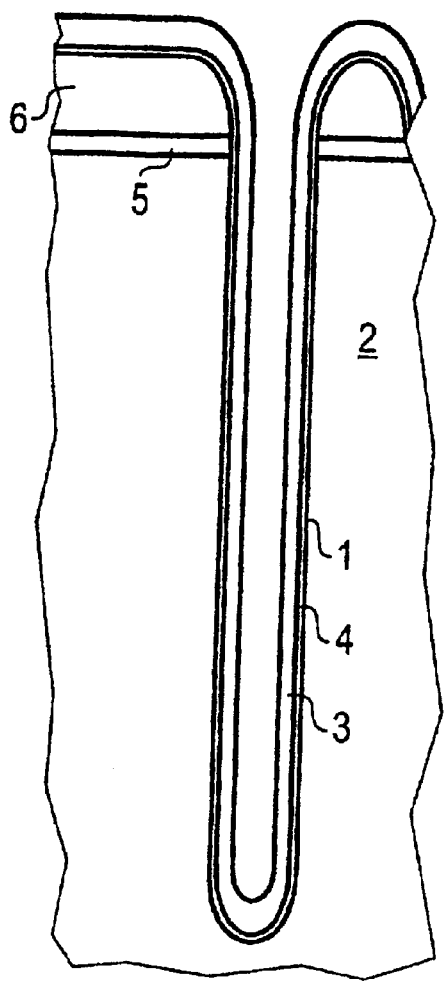
FIG. 1 is a fragmentary, cross-sectional view of a first embodiment of a trench for producing a trench capacitor according to the invention.

Referring now to the figures of the drawings in detail and first, particularly to FIG. 1 thereof, there is shown a first embodiment of the invention with a trench 1 formed in a substrate 2. A mask oxide layer 5 and a mask nitride layer 6 are utilized for etching the trench 1, these being deposited on the substrate and structured. The trench 1 and the mask nitride layer 6 are covered with an undoped silicon oxide layer 4. The term "undoped silicon layer" refers overall to a silicon oxide layer in which the dopant concentration is under $10^{18}$ cm$^{-3}$. Doping under $10^{18}$ cm$-$ is considered weak and has no measurable effect on the underlying invention. On its part, the silicate glass fill 3 covers the undoped silicon oxide layer in the trench 1 and on the mask nitride layer 6.

The first variant of the inventive method for producing a trench capacitor will now be described with reference to FIG. 1. The substrate 2 in which the trench 1 is to be formed is prepared. In the variant, the substrate 2 is slightly doped with p-type dopants such as boron. A mask oxide layer 5 and a mask nitride layer 6 are deposited on the substrate 2 and structured. Next, in an etching step, the trench 1 is etched into the substrate. An undoped silicon oxide layer 4, for instance, a layer 3 nm thick, is deposited in the trench 1 and on the mask nitride layer 6 in an integrated processing step. The deposition can be accomplished with a CVD process utilizing tetra ethyl orthosilicate (TEOS) as a starting substance, which is carried out at 635° C. for three minutes. Doped TEOS is added as the starting material for the CVD deposition during the processing step for the deposition of the undoped silicon oxide layer 4, so that during the subsequent deposition process at 635° C. for 45 minutes, a doped silicate glass fill 3 is deposited in the trench 1 and on the mask nitride layer 6.

Figure 2:
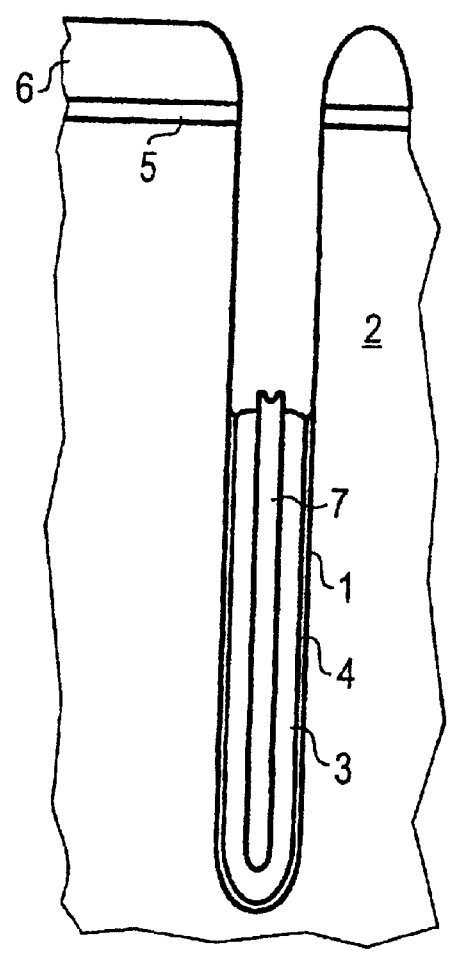
FIG. 2 is a fragmentary, cross-sectional view of the trench of FIG. 1 at a later time in the production method.

With reference to FIG. 2, first a varnish fill 7 is poured into the trench. Next, the varnish fill 7 is sunk into the trench 1 to between one-tenth and one-half the trench depth. The sinking can be carried out with a plasma process that utilizes acid and/or nitrogen at 175° C. Next, the silicate glass fill 3 and undoped silicon oxide layer 4 are also sunk into the trench. Buffered hydrofluoric acid (BHF) in a ratio of 88:10:2 of water:ammonia:hydrofluoric acid ($H_2O:NH_4:HF$) can be applied for 30 seconds to accomplish the sinking.

Figure 3:
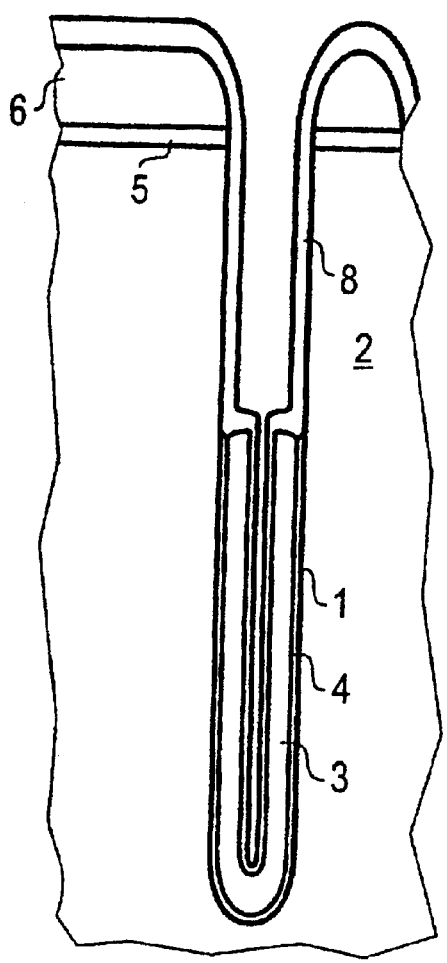
FIG. 3 is a fragmentary, cross-sectional view of the trench of FIG. 2 at a later time in the production method.

With reference to FIG. 3, first the varnish fill 7 is completely removed from the trench, which can be carried out with PIRANHA, this being a matter of concentrated sulfuric acid ($H_2SO_4$, 95%) with a temperature of 110° C.

Next, an oxide cover layer 8 is deposited in the trench 1 and on the mask nitride layer 6. The oxide cover layer 8 is realized with a CVD method that utilizes TEOS as the starting material.

Figure 4:
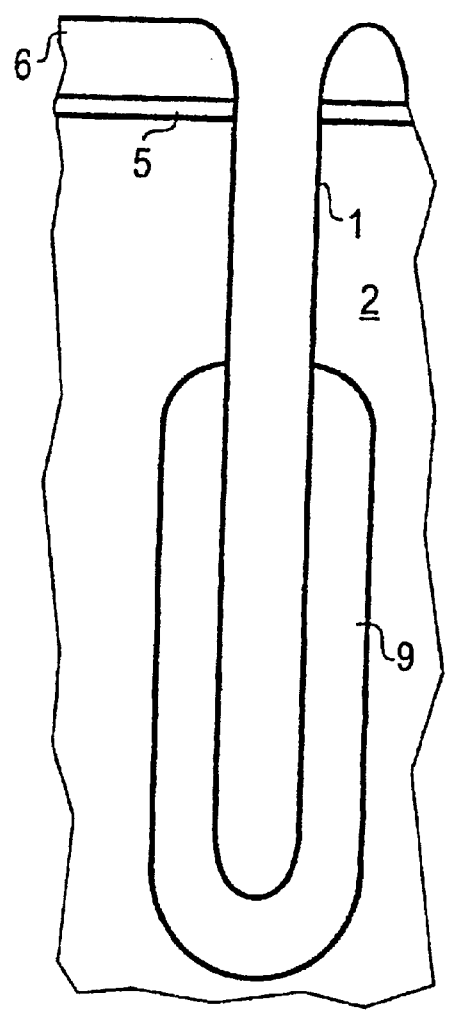
FIG. 4 is a fragmentary, cross-sectional view of the trench of FIG. 3 at a later time in the production method.

FIG. 4 represents the result of a temperature step at approximately 1,000° C. for 90 minutes in a non-oxidizing atmosphere. The buried plate 9 is formed with the dopant from the silicate glass fill 3, achieved by the outdiffusion of dopant. Next, the oxide cover layer 8 and the silicate glass fill 3 are removed from the trench 1, which can be accomplished with BHF in a ratio of 88:10:2.

The method for producing a trench with a buried plate 9 that has been described in connection with FIGS. 1 to 4 has the advantage that no dopant residues remain in the upper region of the trench 1.

According to the second variant of the inventive method for producing a trench with a buried plate, the stage of processing represented in FIG. 1 is followed by the development represented in FIG. 5. The trench 1 is filled with sacrificial silicon 12. The sacrificial silicon 12 may be polysilicon that is produced in a CVD process at 550° C. utilizing silane, i.e., disilane, as the starting material. Next, the doped silicate glass fill 3 and the undoped silicon oxide layer 4 are removed from the upper region of the trench 1. The removal is carried out with another buffered hydrofluoric acid in a ratio of 500:1 of ammonia: hydrofluoric acid for 2 minutes, 20 seconds. In another processing step, an insulating collar 10 is formed by depositing an oxide layer and etching back, for instance, in a CVD process.

With reference to FIG. 6, the configuration is subjected to a temperature step, which first forms 5 nm oxide and then condenses the insulating collar 10 at 1,000° C. for 90 minutes in a nitrogen atmosphere, allowing the dopant to diffuse out of the silicate glass fill 3 into the substrate 2, so that the buried plate 9 forms.

Next, in a reactive ion etching step (RIE) the insulating collar is etched, and, in a second reactive ion etching step, the sacrificial silicon 12 is removed from the trench 1. In the next step, the silicate glass fill 3 including the undoped silicon oxide layer 4—which can be considered doped at this stage of processing as a result of the dopant diffusion—is removed, for instance, with buffered hydrofluoric acid in a ratio of 500:1 of ammonia : hydrofluoric acid for 4 minutes, 10 seconds.

Figure 7:
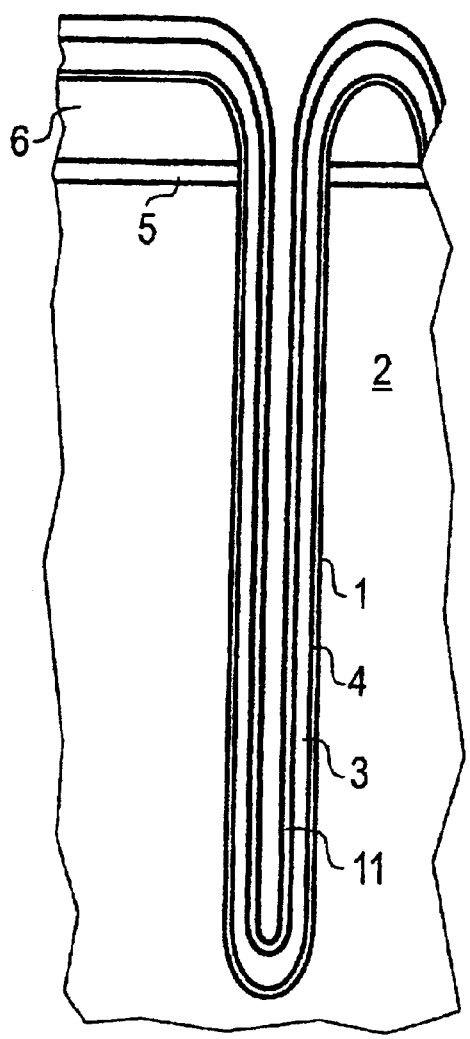
FIG. 7 is a fragmentary, cross-sectional view of the trench FIG. 1 at a later time in a third embodiment of the production method.

FIG. 7 represents a third variant of the inventive method for producing a trench 1 with a buried plate 9. The method is carried out subsequent to the processing stage represented in FIG. 1. After the silicate glass fill 3 is formed, in the integrated processing step the temperature is raised from 635° C. to 650° C., and 20 nm of undoped silicon oxide 11 is deposited in 15 minutes in a CVD TEOS process.

Figure 8:
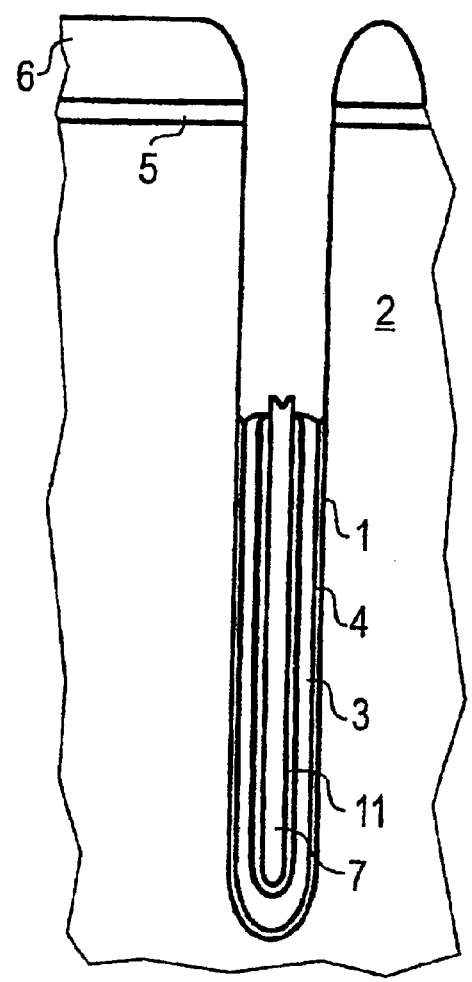
FIG. 8 is a fragmentary, cross-sectional view of the trench of FIG. 7 at a later time in the third production method.

With reference to FIG. 8, a varnish fill 7 is first poured into the trench 1. Next, the varnish fill 7 is sunk to the level represented in FIG. 8, and in a subsequent etching process the silicate glass fill 3 and the undoped silicon oxide layer 4 are removed from the upper region of the trench in 30 seconds with the aid of a buffered hydrofluoric acid etching with a water : ammonia : hydrofluoric acid ($H_2O:NH_4:HF$) ratio of 88:10:2.

Figure 9:
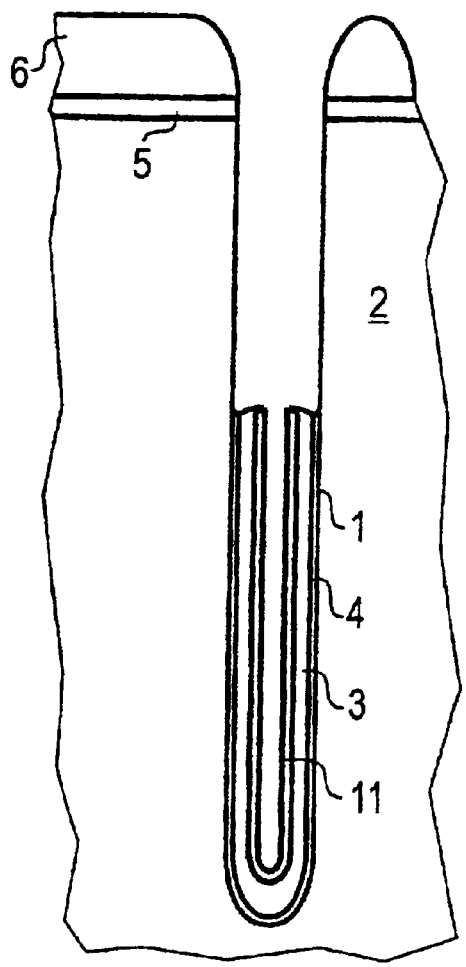
FIG. 9 is a fragmentary, cross-sectional view of the trench of FIG. 8 at a later time in the third production method.

With reference to FIG. 9, the varnish fill 7 is removed from the trench 1 with PIRANHA.

Figure 10:
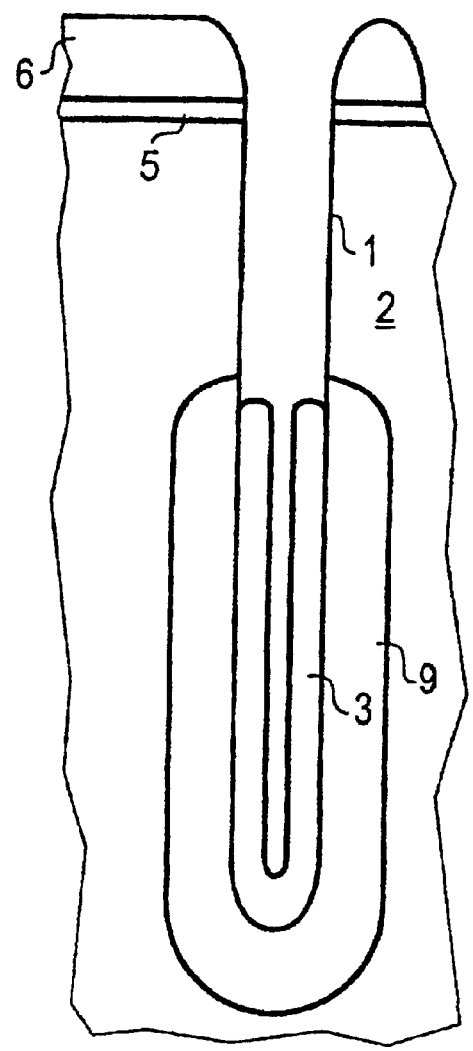
FIG. 10 is a fragmentary, cross-sectional view of the trench of FIG. 9 at a later time in the third production method.

With reference to FIG. 10, in a non-oxidizing temperature step, the dopant from the silicate glass fill 3, which is located in the lower region of the trench 1, is diffused into the substrate 2 through the undoped silicon oxide layer 4, thereby forming the buried plate 9. The temperature step is carried out at approx. 1,000° C. for 90 minutes in a nitrogen atmosphere. In the subsequent processing step, the silicate glass fill 3 and the undoped silicon oxide layer 4, which can be considered doped at this point, are removed by a buffered hydrofluoric acid etching procedure.

We claim:

1. A method for forming a trench with a buried plate, which comprises:

forming a trench in a substrate, the trench having a sidewall, an upper region, and a lower region;

forming a substantially undoped silicon oxide layer on the trench sidewall in the upper and lower regions of the trench;

forming a doped silicate glass fill in the upper and lower regions of the trench;

removing the doped silicate glass fill and the substantially undoped silicon oxide layer from the upper region of the trench with an etching process, the doped silicate glass being completely removed through the underlying undoped silicon oxide; and increasing temperature to diffuse dopant from the doped silicate glass fill into the substrate through the substantially undoped silicon oxide layer and to form a buried plate in the substrate in the lower region of the trench.

2. The method according to claim 1, wherein:

the doping of the substantially undoped silicon oxide layer is less than $10^{18}$ cm$^{-3}$; and the doping of the doped silicate glass fill is greater than $10^{18}$ cm$^{-3}$.

3. The method according to claim 1, which further comprises utilizing at least one of the group consisting of boron, phosphorous, and arsenic for the doping of the doped silicate glass fill.

4. The method according to claim 1, which further comprises carrying out the substantially undoped silicon oxide layer forming step by depositing the substantially undoped silicon oxide layer in an integrated processing step immediately prior to forming the doped silicate glass fill.

5. The method according to claim 1, which further comprises depositing the substantially undoped silicon oxide layer in an integrated processing step immediately prior to the doped silicate glass fill.

6. The method according to claim 1, which further comprises carrying out the substantially undoped silicon oxide layer forming step by forming the substantially undoped silicon oxide layer to a thickness between 0.1 and 25 nm.

7. The method according to claim 1, which further comprises:

filling the trench having the doped silicate glass fill with varnish;

removing the varnish in the upper region of the trench;

removing the doped silicate glass fill and the substantially undoped silicon oxide layer in the upper region of the trench;

removing remaining varnish from the trench;

depositing an oxide cover layer and then increasing temperature to diffuse dopant into the substrate; and removing the oxide cover layer, the doped silicate glass fill, and the substantially undoped silicon oxide layer.

8. The method according to claim 1, which further comprises:

filling the trench having the doped silicate glass fill with varnish;

removing the varnish in the upper region of the trench;

removing the doped silicate glass fill and the substantially undoped silicon oxide layer in the upper region of the trench;

removing remaining varnish from the trench;

depositing an oxide cover layer and then increasing temperature to diffuse dopant into the substrate; and removing the oxide cover layer, and removing the doped silicate glass fill and the substantially undoped silicon oxide layer from the lower region of the trench.

9. The method according to claim 1, which further comprises:
- filling the trench having the doped silicate glass fill with a sacrificial silicon material;
- removing the sacrificial silicon material, the doped silicate glass fill, and the substantially undoped silicon oxide layer in the upper region of the trench;
- subsequently increasing temperature to diffuse dopant into the substrate;
- depositing an insulation trench layer in the upper region of the trench; and
- removing the sacrificial silicon material, the doped silicate glass fill, and the substantially undoped silicon oxide layer from the lower region of the trench.

10. The method according to claim 1, which further comprises:
- depositing a second undoped silicon oxide layer in the trench having the doped silicate glass fill;
- filling the trench with varnish;
- removing the varnish, the second undoped silicon oxide layer, the doped silicate glass fill, and the undoped substantially silicon oxide layer in the upper region of the trench;
- removing the varnish in the lower region of the trench; and
- subsequently increasing temperature to diffuse dopant into the substrate.

* * * * *